United States Patent [19]

Goldstein

[11] Patent Number: 5,576,248
[45] Date of Patent: Nov. 19, 1996

[54] GROUP IV SEMICONDUCTOR THIN FILMS FORMED AT LOW TEMPERATURE USING NANOCRYSTAL PRECURSORS

[75] Inventor: Avery N. Goldstein, Midland, Mich.

[73] Assignee: Starfire Electronic Development & Marketing, Ltd., Bloomfield Hills, Mich.

[21] Appl. No.: 217,160

[22] Filed: Mar. 24, 1994

[51] Int. Cl.$^6$ .................... H01L 21/20; H01L 21/208
[52] U.S. Cl. ............................. 437/225; 437/233
[58] Field of Search ......................... 437/225, 228, 437/233, 173; 136/258, 261

[56] References Cited

U.S. PATENT DOCUMENTS

| | | | |
|---|---|---|---|
| 4,330,358 | 5/1982 | Grabmaier et al. | 136/258 |
| 4,407,858 | 10/1983 | Hanke et al. | 136/258 |
| 5,262,357 | 11/1993 | Alivisatos et al. | 437/233 |

OTHER PUBLICATIONS

J. R. Heath, S. M. Gates, C. A. Chess, "Nanocrystal seeding: A low temperature route to polycrystalline Si films", Appl. Phys.Lett.64(26), 27 Jun. 1994, pp. 3569–3571.

G. Samdani, S. Moore, G. Parkinson, "Tiny Particles Aim for Big Markets", Chemical Eng./Aug. 1994 pp. 35–39.

*Primary Examiner*—R. Bruce Breneman
*Assistant Examiner*—Matthew L. Whipple
*Attorney, Agent, or Firm*—Gifford, Krass, Groh, Sprinkle, Patmore, Anderson & Citkowski

[57] ABSTRACT

Thin films of the Group IV materials silicon and germanium are produced in the range of 2.5 to 25 nm thick from nanocrystal precursors. According to the invention a solid, continuous film of silicon or germanium is formed by depositing a contiguous layer of nanocrystals of the semiconductor materials onto a substrate, then heating the layer to a temperature below the bulk melting temperature which is nonetheless adequate to melt the nanocrystals and form a continuous liquid thin film upon cooling. The resulting thin film may be doped or intrinsic. The lower processing temperatures make it possible to form these thin semi-conductor films with less stringent thermal requirements on the underlayers, substrates and other related structures, thus supporting applications in microelectronics, solar conversion and so forth.

5 Claims, 4 Drawing Sheets

GROUP IV SEMICONDUCTOR THIN FILMS FORMED AT LOW TEMPERATURE USING NANOCRYSTAL PRECURSORS

FIELD OF THE INVENTION

The invention relates to the formation of inorganic semiconductor thin films under moderate thermal conditions, and, in particular, to the formation of Group IV semiconductor films from nanocrystal precursors.

BACKGROUND OF THE INVENTION

The reduction of the melting point in nanometer-sized metal and molecular clusters has been the subject of numerous theoretical studies and simulations (Ph. Buffat and J.-P. Borel, Phys. Rev. A (1976) 13:2287; M. Wautelet, J. Phys. D (1991) 24: 343; F. Ercolessi, W. Andreoni and E. Tossati, Phys. Rev. Let. (1991) 66:911; R. S. Berry, J. Jellinek and G. Natanson, Phys. Rev. A (1984) 30: 919). Work in the semiconductor area has focussed on II–VI and III–V materials, such as CdS (M.L. Stiegerwald et al, J. Am. Chem. Soc. (1988)110:3046; V. L. Colvin, A. N. Goldstein and A. P. Alivisatos, J. Am. Chem. Soc. (1992)114:5221) and GaAs (M. A. Olshavsky, A. N. Goldstein and A. P. Alivisatos, J. Am. Chem. Soc. (1990) 112: 9438). The reduced melting temperature in these binary semiconductor systems has been demonstrated (A. N. Goldstein, C. M. Echer and A. P. Alivisatos, Science (1992)256:1425), albeit with a material dependent tendency towards disproportional prior to melting, such as in the case of GaAs (A. N. Goldstein, Ph. D. dissertation, University of California at Berkeley (1993)).

For several reasons, however, these studies have yet to be extended to more open systems, including the group IV semiconductor materials, in which bonding is predominantly covalent. First, existing models rely on the concept of surface tension, a term difficult to define for covalent nanocrystals. A large proportion of surface atoms has an effect on the thermodynamic properties and, therefore, plays a significant role in the high temperature behavior of such systems.

Secondly, to carry out such investigations, techniques must be developed to synthesize narrow size distributions of the appropriate nanocrystal precursors, and these techniques have not been perfected for the group IV semiconductors. Si and Ge nanocrystals have been produced through evaporative processes (K. A. Littau et al, J. Phys. Chem. (1993) 97:1224; M. Fujii et al, Jap. J. Appl. Phys. (1991)30:687; R. A. Zhitnikov, USSR patent 157,336), but due to the covalent nature of these materials, significantly reduced melting temperatures have not been demonstrated.

The group IV materials carbon, silicon and germanium all exhibit covalent bonding, but the successive addition of filled orbitals transforms the isostructural compounds from insulator through semiconductor to a more metallic character. The effect of these changes in electronic structure on the nanocrystal thermodynamic property of melting is not obvious. Moreover, Group IV materials cannot exhibit disproportion. Disproportionation is the selective volatilization of one type of atom in heteroatomic material, resulting in an enrichment in the more stable species. Instances in which selective loss of small amounts of one type of atom from the nanocrystal surface entropically drives the melting process cannot exist for the Group IV materials.

SUMMARY OF THE INVENTION

According to the present invention a solid, continuous film of a Group IV semiconductor material is formed by depositing a contiguous layer of nanocrystals of the semiconducting material onto a substrate, then heating the layer to a temperature below the bulk melting temperature of the semiconductor material but at a temperature which is nonetheless adequate to melt the nanocrystals, thus forming a continuous liquid thin film. Upon cooling, this liquid film forms a continuous solid. In the preferred embodiment, the resulting thin film is comprised of silicon or germanium, including doped forms of these elements.

Applications include microelectronics fabrication, solar conversion technologies, and the like, since the lower processing temperatures make it possible to form thin films with less stringent thermal requirements on the underlayers, substrates and other related structures.

BRIEF DESCRIPTION OF THE DRAWINGS

This invention will be described in greater detail with reference to the accompanying figures, wherein.

DETAILED DESCRIPTION OF THE PREFERRED EMBODIMENTS

Figure 1:
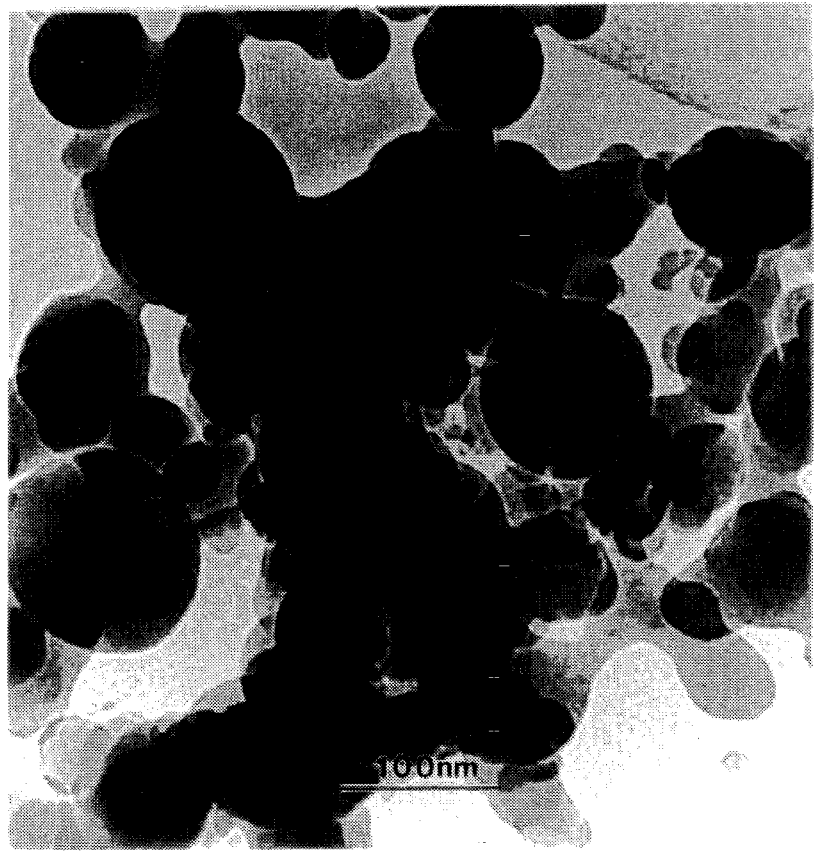
FIG. 1 is a low magnification transmission electron micrograph showing a field of silicon nanocrystals produced by a chemical etch.

The present invention yields semiconductor thin films through the fusion of nanocrystals at temperatures substantially below their bulk melting temperature. In particular, nanocrystals of the Group IV semiconductors germanium and silicon exhibit a reduced melting temperature compared to that of the bulk, approaching 1000 K. for the smallest nanocrystals. Thin films are prepared from a contiguous dispersion of these nanocrystals on a substrate which is heated to a temperature not exceeding 200 K. below the bulk melting temperature. Upon cooling, a continuous thin film results with a thickness relating to the original nanocrystal diameters. A less rigorous heating cycle which is sufficient only to cause a minimal sintering yields a porous thin film that retains the electronic properties of the individual nanocrystals. According to the invention a nanocrystal is defined as a crystal having dimensions from 1 to 100 nm. The depression in melting and annealing temperature is evident throughout the nanocrystal size regime, but in the preferred embodiment these materials range in size from 1 to 6 nm.

The silicon and germanium particles may be produced by a variety of techniques including, but not exclusively evaporation, laser ablation, electrolysis, photolysis, thermolysis, microwave discharge, and chemical etching methods. The silicon nanocrystals may be prepared by etching a silicon wafer by chemical means or in concert with electric current. A 30% HF, 30% HNO3 aqueous solution is satisfactory in dissolving silicon. After exposure of the silicon wafer to the etching solution so as to discolor and pit the wafer, multiple washes with ethanol are performed and the wafer subjected to sonication in an ethanolic solution.

Colloidal silicon particles of sizes ranging from 3 to 100 nm are isolated from the suspension. Subsequent agglomeration is inhibited by a thin passivating oxide layer and the chemisorption of ethylene glycol to the particle surface. An electrochemical synthesis of silicon nanocrystals is described by Petrova-Koch, Muschik, Kux, Meyer and Koch in Appl. Phys. Let. (1992)61:943. An etching solution of 50% HF in ethanol (1:1) is used in conjunction with current densities on the order of 30–300 mA/cm2. This is followed by rapid thermal oxidation to passivate the surface of the resulting porous silicon. The wafer is then sonicated as previously described to yield a suspension of isolated Si nanocrystals.

Colloidal nanocrystals of the Group IV materials silicon and germanium may also be prepared by evaporating the material in vacuo. By condensing the vapors on the surface of a liquid such as paraffin followed by extraction of the nanocrystals into a coordinating solvent, appreciable quantities of nanocrystalline material is obtained with a narrow size distribution. The surface passivatioon may be affected by modifying the gas mixture used to repressurize the vacuum apparatus. Oxygen, hydrogen and fluorine are representative gases that adsorb on the nanocrystal surfaces. This general method is described in greater detail in R. A. Zhitnikov et al, Probory i Tebn. Eksperin (1964)9:180, which is incorporated herein by reference. The liquid surface functions to prevent distortion of the gaseous particle upon impact with the substrate and also lessening agglomeration effects. The methods herein are only representative and other methods also provide nanocrystals of these materials.

A continuous layer of nanocrystals is one in which enough particles are present to form a layer of particles touching one another. If the particles are not touching, they will not flow together when fused. Thicker layers of up to three or four particles deep can be employed, however, vastly thicker layers such as 20 or 30 particles deep begins to act as bulk materials and do not properly fuse at the low temperatures employed.

The fusing of the nanocrystals takes place below the bulk melting temperature and in the most extreme sizes as much as 1000 K. below the bulk melting temperature of the semiconductor compound. Typically, this heating is carried out under vacuum and is completed within 15 seconds to 30 minutes. The products of this process are continuous thin films of semiconducting materials corresponding in stoichiometry to the nanocrystals from which they are formed.

These films, 2.5 to 20 nm in thickness, can be formed on any suitable surface or substrate, for example on carbon, silicon, selenium dioxide, or other oxides such as alumina, boria, titania; on metals such as gold, copper, silver, aluminum, or the like; on high temperature, thermally stable polymers such as aramids, carbonates, esters and the like. This last family of substrates is important as the process of the invention with its low operating temperatures allows for such deposit of semiconductors which could not be achieved practically with current processes.

EXAMPLE 1

A suspension of silicon nanocrystals was prepared by etching of a silicon wafer in a 30% HF, 30% $HNO_3$ aqueous solution. The wafer was then washed in absolute ethanol and sonicated for 30 minutes in absolute ethanol. The solution was vacuum filtered through a fine mesh sintered glass frit. A droplet of the resulting solution is then placed on an amorphous carbon substrate which is supported by a 300 mesh titanium grid. The droplet was allowed to evaporate slowly, thus concentrating the suspended nanocrystals. The particle size distribution and the melting temperature, $T_m$, are determined by transmission electron microscopy (TEM). Electron diffraction confirmed that the nanocrystals were silicon by comparing the diffraction patterns against the internal standard of the titanium grid bars.

Figure 2:
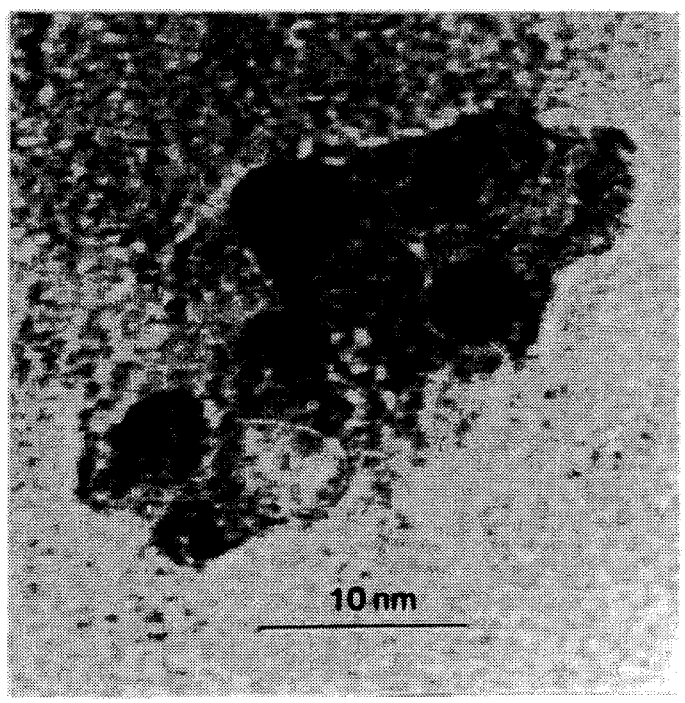
FIG. 2 is a high magnification transmission electron micrograph of five silicon nanocrystals taken at ambient temperature, wherein lattice fringes are visible throughout the particles.

Making reference to FIG. 2, the silicon nanocrystals range in size from 2.8 to 100 nm, as determined by TEM imaging, and are observed to contain an sizeable fraction of interconnected particles, due to incomplete etching. The melting temperature, $T_m$, was defined by the loss of crystallinity within a nanocrystal and by morphological changes. By examining the changes within individual nanocrystals, the necessity of deconvoluting the size distribution are removed.

It was observed that the silicon nanocrystals melt and recrystallize at size dependent temperatures dramatically lower than that of bulk silicon. The melting experiments were conducted at a magnification of 250,000X. The sample was heated in 25 K. increments using a JEOL 100CX electron microscope, with images being recorded at regular intervals.

Figure 3:
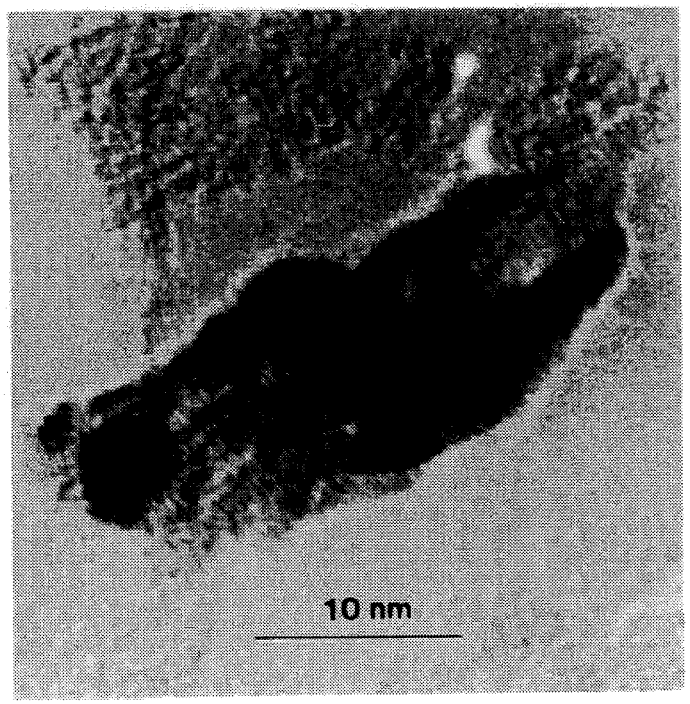
FIG. 3 is a high magnification transmission electron micrograph of the region shown in FIG. 2, taken at 1150 K, the loss of lattice fringes and morphological changes being noted as compared to FIG. 2.
Figure 4:
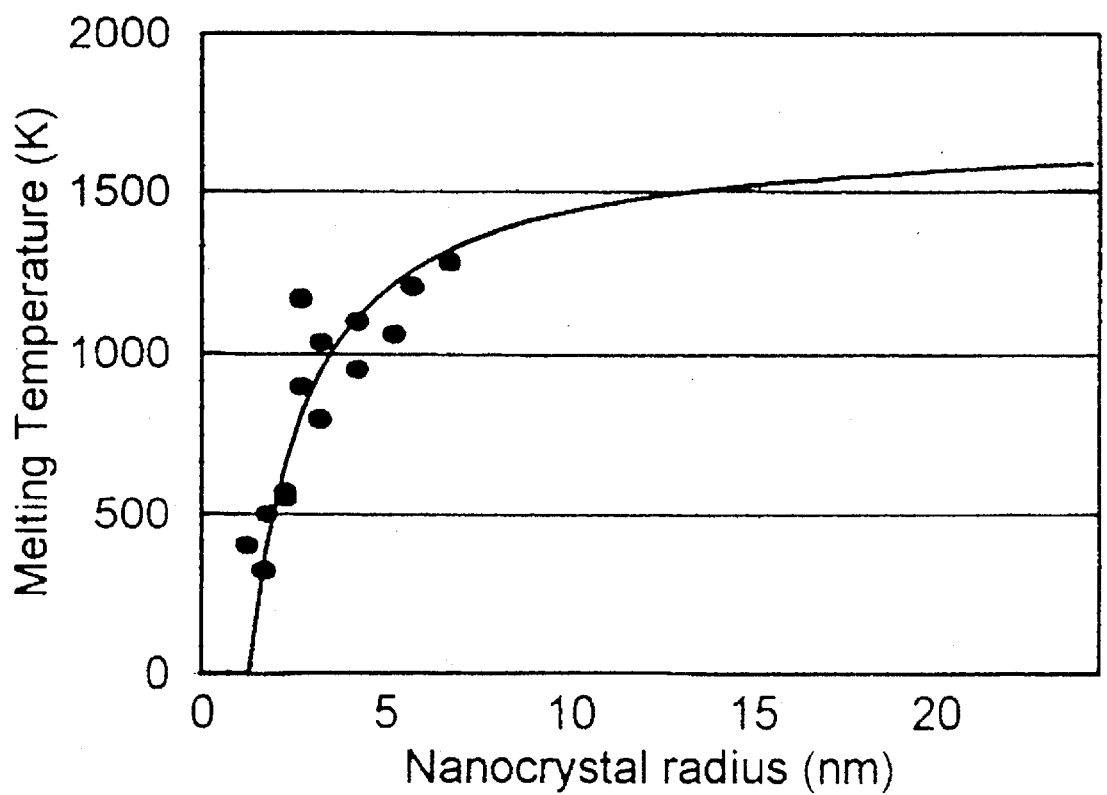
FIG. 4 is a graph showing the relationship between nanocrystal size and melting temperature and a fit of the experimental data.

Melting temperature, $T_m$, for individual particles was determined by comparing consecutive images, the results of the heating cycle being show in FIGS. 3 and 4. In FIG. 3, a TEM micrograph of several silicon nanocrystals prepared by chemical etching taken at 273 K shows predominantly the silicon {111}lattice fringes. As shown in FIG. 4, at 1150 K. a change in nanocrystal shape is observed as well as a loss of internal order. The smallest nanocrystals are well above their respective melting temperatures, particles 1 and 2 have fused with the particles directly below them. The molten particles appear more electron dense owing to the higher density of the liquid; the densification results from the coordination number changing from 4 to about 5.5 upon melting.

Degradation of the thin carbon substrate is also apparent in FIG. 4, owing to thermal gradients and beam exposure. When these nanocrystals are dispersed at sufficiently low densities so as to avoid contact between neighboring particles, melting and recrystallization occur with no significant changes in particle morphology, although lattice orientation relative to the substrate upon recrystallization is not necessarily preserved.

At nanocrystal densities where the particles are contiguous, the molten particles fuse to form a thin polycrystalline film at a temperature dependent on the particle size and below the bulk melting temperature of silicon, 1698 K. Examination of tens of nanocrystals shows that the silicon nanocrystals melt at a temperature proportional to inverse radius (see FIG. 4). Nanocrystals in contact with others can be cycled through solid-liquid transformations without change in size or spherical shape, whereas adjoining nanocrystals sinter to form a polycrystalline thin film.

EXAMPLE 2

Colloidal germanium nanocrystals were prepared by evaporation onto a liquid surface. Two grams of 99.95% germanium powder were placed in a tungsten evaporation boat mount in a standard vacuum evaporator. A crystallization dish containing about a 0.5 cm thick layer of crumbled wax was placed on the base of the evaporator chamber and a resistive heating coil inserted into the crystallization dish.

The bell jar was then evacuated to a pressure of 1×10–5 torr and the wax melted using the heating element. Upon stabilization of the pressure, the tungsten boat containing the germanium powder was heated until white hot for about 30 seconds. The wax was then cooled until solidified, and the chamber vented. Particle size varied between 3 and 50 nm.

The germanium particle coated wax plaque was then dissolved in a mixture of 95% toluene, 5% pyridine. Dialysis in the same solvent serves remove the dissolved wax from the solution. When adjoining nanocrystals prepared in this way are heated as in Example 1 they behave similarly, yielding a fused thin film at temperatures significantly below the bulk melting temperature, when the nanocrystals are adjoining.

EXAMPLE 3

The preparation in Example 2 is repeated with the dissolution of the wax being completed with 95% petroleum ether, 5% tetrahydrofuran. When adjoining nanocrystals prepared in this way were heated as in Example 1 they behave similarly, yielding a fused thin film at temperatures significantly below the bulk melting temperature, when the nanocrystals are adjoining.

EXAMPLE 4

The preparation in Example 3 was repeated with silicon replacing germanium. When adjoining nanocrystals prepared in this way are heated as in Example 1 they behave similarly, yielding a fused thin film at temperatures significantly below the bulk melting temperature, when the nanocrystals are adjoining.

EXAMPLE 5

The preparation in Example 3 was repeated with a liquid surface of polyvinyl acetate. The particles were removed from the polymer surface by dissolution in an ethanolic EDTA solution. When adjoining nanocrystals prepared in this way are heated as in Example 1 they behave similarly yielding a fused thin film at temperatures significantly below the bulk melting temperature, when the nanocrystals are adjoining.

Having thus described my invention, I claim:

1. A method of forming a solid, continuous film of a Group IV semiconductor material on a surface, comprising the steps of:

depositing on the substrate surface a thin, contiguous layer of nanocrystals of the semiconducting material, the size of the nanocrystals being sufficiently small that surface effects contribute to melting temperature;

melting the nanocrystals at a temperature below the bulk melting temperature of the semiconductor material in order to form a continuous liquid thin film; and cooling the liquid thin to form a solid thin film.

2. The process of claim 1 wherein the semiconducting material is silicon.

3. The process of claim 1 wherein the semiconducting material is germanium.

4. The process of claim 1 wherein the nanocrystals have an average diameter of from 1 to 6 nm.

5. The method of claim 1 wherein the step of cooling the liquid thin film to form a solid thin film includes forming a thin film in the range of 2.5 to 25 nm.

* * * * *